United States Patent [19]

Ogawa

[11] 4,386,327
[45] May 31, 1983

[54] INTEGRATED CIRCUIT CLAPP OSCILLATOR USING TRANSISTOR CAPACITANCES

[75] Inventor: Atsushi Ogawa, Yokohama, Japan
[73] Assignee: Tokyo Shibaura Denki Kabushiki Kaisha, Kawasaki, Japan
[21] Appl. No.: 212,745
[22] Filed: Dec. 3, 1980

[30] Foreign Application Priority Data

Dec. 20, 1979 [JP] Japan ................. 54/165973
Dec. 20, 1979 [JP] Japan ................. 54/165974

[51] Int. Cl.³ ........................... H03B 5/12
[52] U.S. Cl. ................. 331/108 D; 331/117 R; 357/51
[58] Field of Search ....... 331/117 R, 108 C, 108 D; 357/46, 51

[56] References Cited

U.S. PATENT DOCUMENTS

| | | | |
|---|---|---|---|
| 3,323,513 | 6/1967 | Gnadke | 331/177 R X |
| 3,519,891 | 7/1970 | Leinkram | 357/51 X |
| 3,544,862 | 12/1970 | Gallagher et al. | 357/51 X |
| 3,865,648 | 2/1975 | Castrucci et al. | 357/46 X |

FOREIGN PATENT DOCUMENTS 1922541 12/1969 Fed. Rep. of Germany .
1902339 7/1970 Fed. Rep. of Germany .
491536 7/1970 Switzerland .

OTHER PUBLICATIONS

Kasuga, "FM Stereo Tuner", Nippon Hoso Shuppan Kyokai, Apr. 20, 1960, p. 94.
Lesk, "Material-Interface Problems in Integrated Circuitry", Transactions of the Metallurgical Society of AIME, vol. 233, Mar. 1965, pp. 578–587.

Primary Examiner—Siegfried H. Grimm
Attorney, Agent, or Firm—Cushman, Darby & Cushman

[57] ABSTRACT

An integrated circuit oscillator which includes an oscillator with an oscillation transistor being formed in a semiconductor substrate for oscillating and providing an output signal, a first junction capacitor connected between a power supply line and the emitter of the oscillation transistor, a second junction capacitor connected between the emitter and the base of the oscillation transistor, and a resonance circuit connected between the base of oscillation transistor and the power supply line. The first and second junction capacitors are formed in the semiconductor substrate such that the second junction capacitor is formed on the first junction capacitor in the form of a transistor structure.

35 Claims, 15 Drawing Figures

F I G. 12
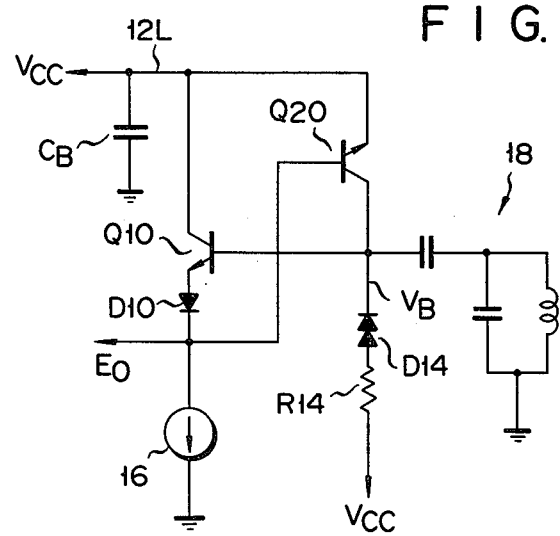
F I G. 13
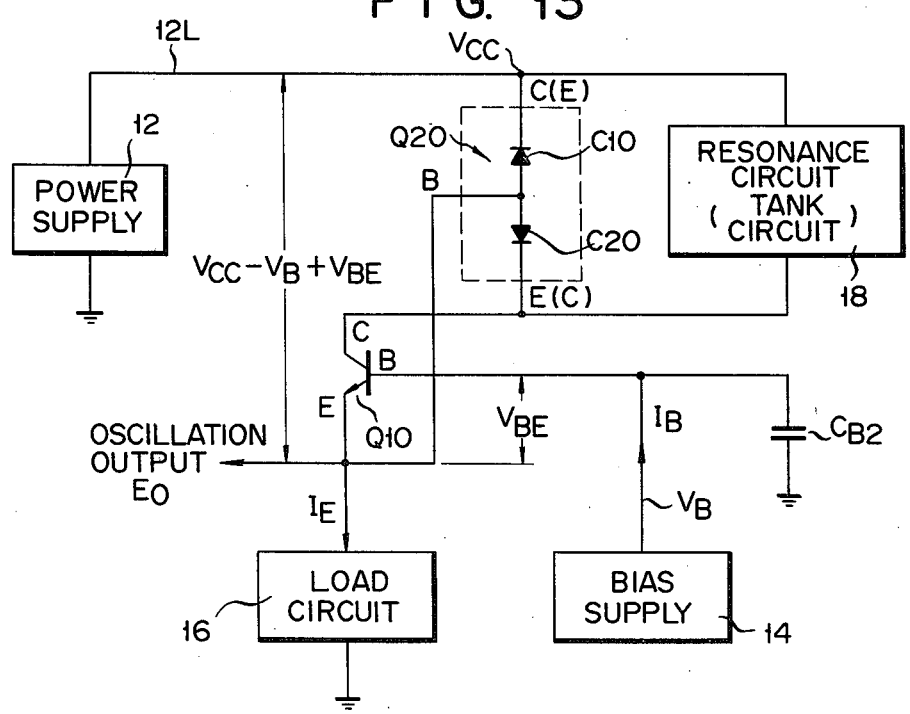

INTEGRATED CIRCUIT CLAPP OSCILLATOR USING TRANSISTOR CAPACITANCES

The present invention relates to an oscillator used as a local oscillator for a radio tuner and, more particularly, to an improved oscillator suitable for ICs.

A Clapp type oscillation circuit as shown in FIG. 1 is suitable as a local oscillation circuit to be used at the front end part of an FM tuner. When forming such an oscillation circuit with an IC technique, dividing capacitors C1 and C2 of an IC resonance circuit or a tank circuit 1 may be formed inside a semiconductor pellet, i.e., an IC chip. The chip size is preferably small for reducing the cost of the IC. For making the chip size small, the capacitors C1 and C2 may utilize junction capacitance. As the term junction capacitance is generally used it is the capacitance of a reversely biased P-N junction.

FIG. 2 shows an example of a configuration for forming an oscillation transistor Q1 and the dividing capacitors C1 and C2 inside the IC chip in the circuitry shown in FIG. 1. With this IC configuration, however, the P-N junction capacitors C1 and C2 must be formed independently of each other. Thus, since the capacitors C1 and C2 both occupy their own places in the IC chip, the chip size tends to be enlarged. With the configuration shown in FIG. 2, a parasitic capacitor C2a is undesirably formed between an N type region 3 of the capacitor C2 and a P type substrate 2. This parasitic capacitor C2a is undesirable since it prohibits the oscillation of the Clapp oscillator.

FIG. 3 shows the equivalent circuit of the Clapp oscillator of the configuration shown in FIG. 2. A diode C2 corresponds to the P-N junction capacitor formed by the N type region 3 and the P type region 4, and a resistor r2 shows the equivalent diffusion resistance of the regions of the P-N junction. Similarly, a diode C1 is a capacitor formed by an N type region 5 and a P type region 6, and a resistor r1 shows the diffusion resistance. The diode C2a is the parasitic capacitor formed by the region 3 and the substrate 2, and diode C1a is the parasitic capacitor formed by the region 5 and the substrate 2. Resistors r1a and r2a are diffusion resistances with the diodes C1a and C2a. The parasitic capacitance formed by the diode C2a mainly provides adverse effects to the oscillation of the oscillator.

The present invention has been made in consideration of this and has for its object to provide an oscillator which may be made small when formed into an IC and which is not adversely affected by parasitic capacitance.

In order to accomplish the above and other objects, the present invention provides an oscillator comprising: an active element being formed in a semiconductor substrate and having first, second and third electrodes, the second electrode being connected to a resonance circuit adapted for the oscillator; a first junction capacitor connected between a power supply line and the first electrode of the active element; and a second junction capacitor connected between the first electrode and the second electrode of the active element; wherein the first and second junction capacitors are formed in the same spot of the semiconductor substrate.

With the oscillator of the above configuration, for example, a first junction capacitor is first formed on the semiconductor substrate, and a second junction capacitor is formed on this capacitor structure. In other words, the dividing capacitors of the oscillator, i.e., the first and second junction capacitors, have a stacked configuration. Accordingly, the IC chip size may be made smaller with the present invention than in the case shown in FIG. 2 wherein the dividing capacitors are formed in different spots of the substrate. Further, since the first junction capacitor is interposed between the substrate and the second junction capacitor connected to the second electrode (the base in FIG. 4; the collector in FIG. 13) of the active element (oscillation transistor Q10), a parasitic capacitor is not formed between the second electrode and the substrate. Therefore, the oscillator according to the present invention is capable of stable oscillation operation.

A parasitic capacitor is formed between the first junction capacitor and the substrate. However, this parasitic capacitor functions to bypass the power supply line to the substrate (circuit ground). Unlike in the configuration shown in FIG. 2, the parasitic capacitor generated in the present invention is useful.

This invention can be more fully understood from the following detailed description when taken in conjunction with the accompanying drawings, in which:

FIG. 12 shows a modification of FIG. 10;

FIG. 13 shows another basic configuration of the oscillator of the present invention;

Before proceeding with the description of the embodiments of the invention, it will be expressly understood that like reference symbols are used to designate like portions throughout the drawings for simplicity of illustration and that components designated by like reference symbols may easily be replaced with each other or one another with minor change by a person skilled in the art. An embodiment of an oscillator according to the invention will be described.

Figure 4:
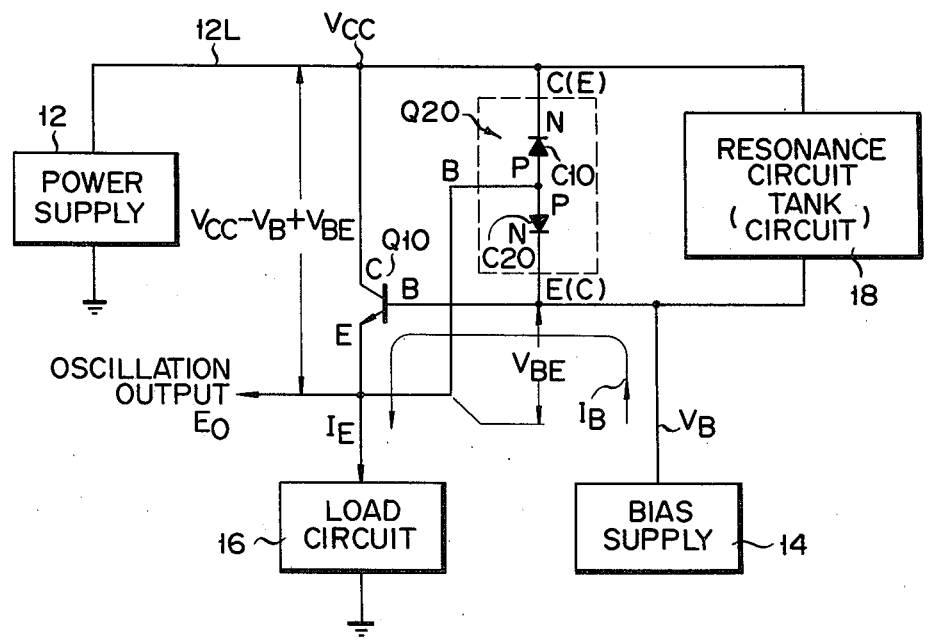
FIG. 4 shows one basic configuration of the oscillator of the present invention.

FIG. 4 shows a basic configuration of an oscillator of the present invention. The collector of an active element or an NPN type oscillation transistor Q10 is connected to a power supply 12 for supplying a power voltage Vcc through a power supply line 12L. The power supply including the power suppy line 12L has sufficiently small impedance at the oscillation frequency of the oscillator. The base of the transistor Q10 is connected to a bias supply 14. The bias supply 14 provides a bias current IB for activating the transistor Q10. The bias voltage potential VB supplied by the bias supply 14 is generally set to be the same as the power voltage potential Vcc or less. The emitter of the transistor Q10 is grounded through a load circuit 16. A resonance circuit or tank circuit 18 is connected between the base of the transistor Q10 and the fixed reference potential circuit for signal frequencies, e.g., the power supply line 12L. The circuit 18 includes a reactance network for determining the oscillation frequency of the oscillator.

The cathode and the anode of a first P-N junction diode C10 are connected to the collector and the emitter of the transistor Q10. The cathode and the anode of a second P-N junction diode C20 are connected to the base and the emitter of the transistor Q10. The diode C20 is reversely biased by the base-emitter forward voltage drop VBE of the transistor Q10, and the diode C10 is reversely biased by the collector-emitter voltage (Vcc−VB+VBE) of the transistor Q10. In this case, both the diodes C10 and C20 are reversely biased and function as capacitors. Thus, the diodes C10 and C20 function as the dividing capacitors of the Clapp oscillator. An oscillation output signal Eo of the oscillator is obtained from the emitter of the transistor Q10.

In order to accomplish the object of the present invention, it is preferable to form by diffusion an N type region for providing the diode C20 in the P type region of the diode C10. Then, the diodes C10 and C20 form a bipolar transistor structure of planar type. The combination of diodes C10 and C20 is therefore equivalent to a bipolar transistor Q20 wherein the base is connected to the emitter of the transistor Q10, the collector (or the emitter) of the transistor Q20 is connected to the collector of the transistor Q10, and the emitter (or the collector) of the transistor Q20 is connected to the base of the transistor Q10.

Figure 5:
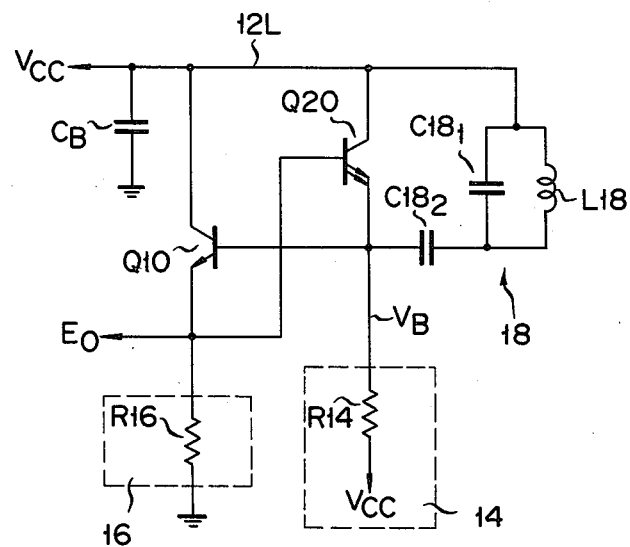
FIG. 5 shows a circuit diagram of one embodiment of the configuration shown in FIG. 4.

FIG. 5 shows a circuit diagram of an embodiment of the configuration of FIG. 4. The collector of the NPN transistor Q10 is connected to the power supply line 12L with the voltage Vcc. The emitter of the transistor Q10 is grounded through a load resistor R16. The base of the transistor Q10 is connected to the line 12L through a bias resistor R14. The base of the transistor Q10 is connected to the line 12L through a capacitor C18$_2$ and a parallel resonance circuit consisting of a capacitor C18$_1$ and an inductor L18. The base of the transistor Q10 is also connected to the line 12L through the emitter-collector path of the NPN transistor Q20. The base of the transistor Q20 is connected to the emitter of the transistor Q10. The line 12L is grounded through a bypass capacitor CB. The capacitor CB reduces the HF impedance of the line 12L.

Figure 6:
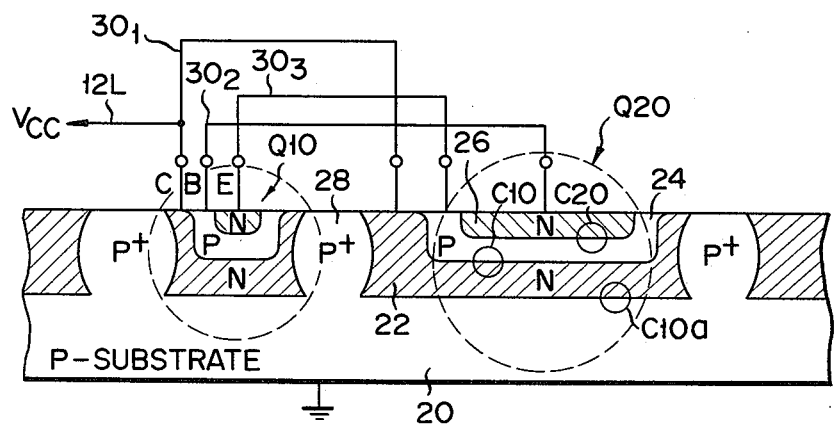
FIG. 6 shows an example of a configuration of the main part of the circuit shown in FIG. 5 when formed into an IC.

FIG. 6 shows a configuration of the transistors Q10 and Q20 of the circuitry shown in FIG. 5 when formed into an IC. The transistors Q10 and Q20 are formed by diffusion in a P type substrate 20 by the conventional planar transistor manufacturing method. An N type region 22 is diffused into the substrate 20 simultaneously with an N type collector region of the transistor Q10. A P type region 24 is diffused into the region 22 simultaneously with the P type base region of the transistor Q10. Subsequently, an N type region forming the emitter of the transistor Q10 and an N type region 26 inside the region 24 are formed. The collector region of the transistor Q10 and the N type region 22 are isolated by a P+ to type separation region 28. The regions 22, 26 and 24 are connected to the collector, the base, and the emitter of the transistor Q10 through aluminum wiring layers 30$_1$, 30$_2$ and 30$_3$, respectively. A P-N junction diode formed by the regions 22 and 24 forms a first dividing capacitor C10, and a P-N junction diode formed by the regions 24 and 26 forms a second dividing capacitor C20. A P-N junction formed between the region 22 and the substrate 20 becomes a parasitic capacitor C10$a$.

Figure 7:
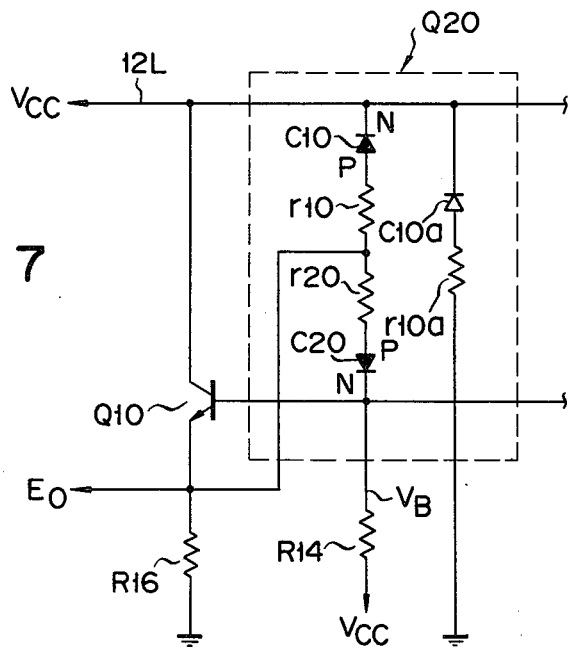
FIG. 7 shows an equivalent circuit of a Clapp oscillator of the configuration shown in FIG. 6.

FIG. 7 shows an equivalent circuit of a Clapp oscillator having the configuration shown in FIG. 6. Resistors r10 and r20 each shows diffusion resistance or equivalent series resistance of the dividing capacitors (P-N junction diodes) C10 and C20. A resistor r10$a$ is a diffusion resistance of the parasitic capacitor (P-N junction diode) C10$a$. Although the resistance values of the resistors r10 and r20 are very small, they may not be zero as long as the capacitors C10 and C20 are formed by diffusion. However, it is possible to make the resistance values of these resistors sufficiently small so that they are practically negligible.

Figure 1:
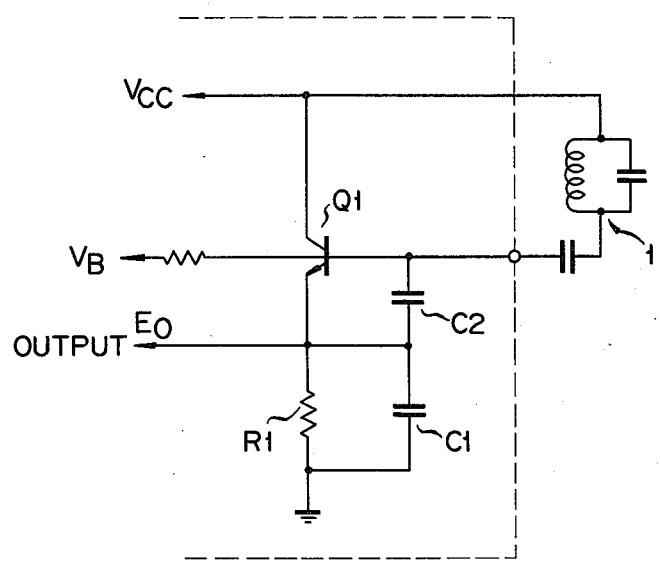
FIG. 1 shows the circuitry of a Clapp type oscillator.
Figure 2:
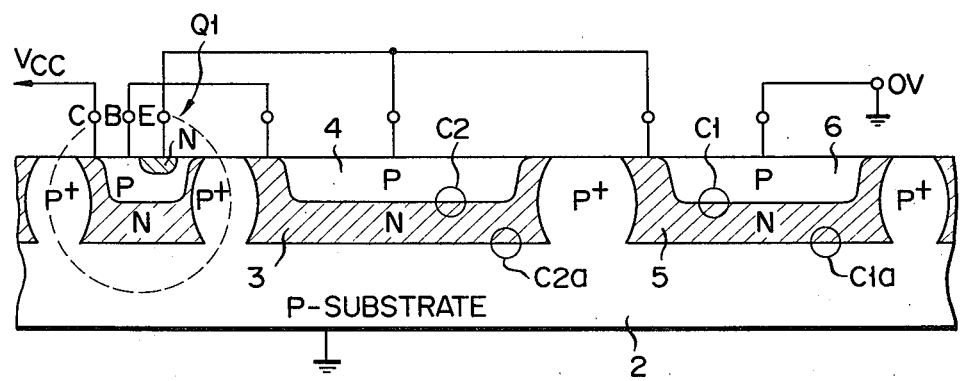
FIG. 2 shows an example of a configuration of the main part of the circuit shown in FIG. 1 when formed into an IC.
Figure 3:
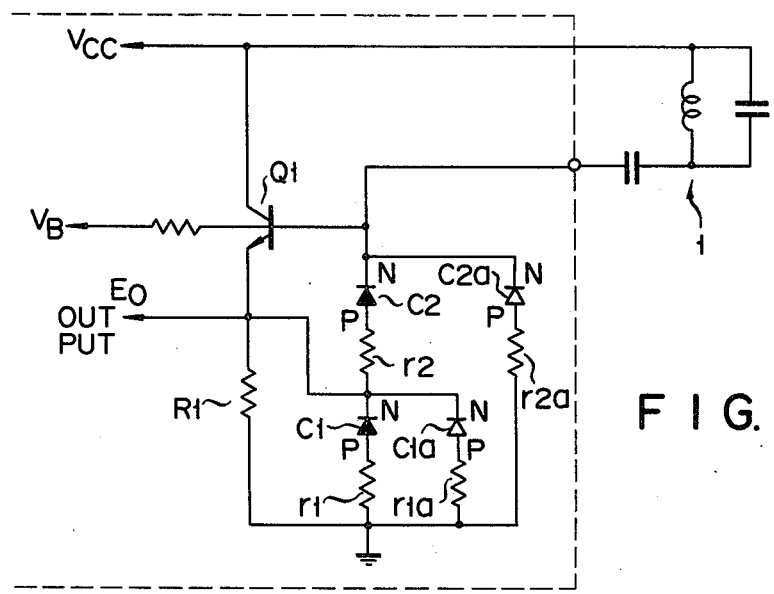
FIG. 3 shows an equivalent circuit of the Clapp oscillator of the configuration shown in FIG. 2.

The following may be seen from a comparison of FIGS. 3 and 7.

First, in FIG. 7, the parasitic capacitor C2$a$ bypassing the base circuit of the transistor Q10 to the circuit ground (or the power supply line 12L) is not present. Accordingly, the Clapp oscillator of the present invention as shown in FIG. 5 or 6 is capable of stable oscillating operation.

Secondly, in FIG. 7, the capacitor C10$a$ bypassing the collector circuit of the transistor Q10, i.e., the power supply line 12L, to the circuit ground is present. Since this capacitor C10$a$ reduces the AC impedance of the power source at the oscillation frequency, this also enables the stable oscillating operation of the oscillator.

The capacitance of the P-N junction capacitor changes according to the reverse bias voltage applied to this junction. In FIG. 4, although the oscillation frequency of the oscillator is mainly determined by the resonance circuit (LC network) 18, the oscillation frequency also changes with the capacitances of the diodes C10 and C20. The reverse bias voltage to the diode C10 becomes:

$$Vcc - VB + VBE \qquad (1)$$

The reverse bias voltage to the diode C20 becomes the base-emitter forward voltage drop VBE of the transistor Q10. When the transistor Q10 is a silicon transistor, the voltage VBE becomes about 0.6 to 0.7 V at room temperature ($\approx 300°$ K.). The voltage VBE does not change much even when the power supply voltage Vcc fluctuates. Therefore, the capacitance of the diode C20 does not substantially change even when the voltage Vcc changes. However, when the voltage Vcc changes, the emitter current or the base current of the transistor Q10 changes so that the input capacitance of the transistor Q10 changes slightly. This capacitance change causes the oscillation frequency to fluctuate. When the reverse bias voltage as represented by the relation (1) changes, the capacitance of the diode C10 also changes. This change in the voltage, i.e., Vcc−VB+VBE results in a change in the oscillation frequency.

To prevent the capacitance C20 from changing it suffices to satisfy the following relation:

$$\partial VBE / \partial Vcc = 0 \qquad (2)$$

To satisfy the relation (2), the emitter current IE or the base current IB must be kept constant. That is, the capacitance C20 and also the input capacitance of the transistor Q10 do not change even when the voltage Vcc changes if the following relation is satisfied:

$$\partial IE/\partial Vcc = 0 \qquad (3)$$

or $$\partial IB/\partial Vcc = 0 \qquad (4)$$

To prevent a change in the capacitance C10 due to a change in the voltage Vcc, the following relation must be satisfied:

$$\partial(Vcc - VB + VBE)/\partial Vcc = 0 \qquad (5)$$

Now, a case where the following relation is satisfied is considered:

$$VB = kVcc \qquad (6)$$

where k denotes a proportional constant. When the relation (6) is substituted into the relation (5), the following relation is obtained:

$$\partial\{(1-k) Vcc + VBE\}/\partial Vcc = 0 \qquad (7)$$

The relation (7) becomes equal to the relation (2) when k=1, i.e., VB=Vcc. Thus, when the relation (3) or (4) and VB=Vcc are satisfied, the capacitances C10 and C20 are not affected by changes of the voltage Vcc. When VB=Vcc, the cathode DC potential of the diode C10 and the cathode DC potential of the diode C20 become equal taking the emitter of the transistor Q10 as the reference potential. In this case, no leakage current flows from the cathode of the diode C10 to the cathode of the diode C20, or vice versa. Further, since the reverse bias voltage applied to the diodes C10 and C20 is small (about 0.6 V), the capacitances of the diodes C10 and C20 may be made higher with ease. (The P-N junction capacitance becomes smaller as the reverse bias voltage becomes greater.)

Figure 8:
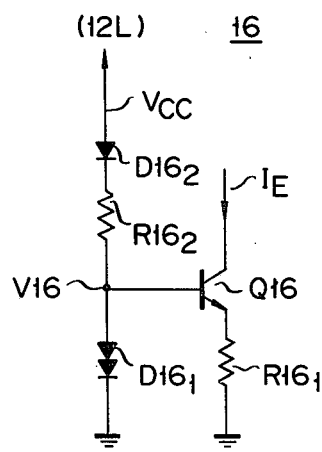
FIG. 8 shows an example of a circuit for forming the load circuit shown in FIG. 4 with a constant current source circuit.

FIG. 8 shows an embodiment satisfying the relation (2). The load circuit 16 of FIG. 4 comprises a constant current source circuit. The emitter of the oscillation transistor Q10 (shown in FIGS. 4 to 7) is connected to the collector of an NPN transistor Q16. The emitter of the transistor Q16 is grounded through the resistor R16₁. The base of the transistor Q16 is grounded through the anode-cathode path of a stacked diode block D16₁. The base of the transistor Q16 is connected to the power supply line 12L through a resistor R16₂ and a diode D16₂. The forward voltage drop V16 of the diode block D16₁ does not substantially change even when the voltage Vcc changes. Thus, the base current and the collector current (IE) of the transistor Q16 become substantially constant even when the voltage Vcc changes.

Figure 9:
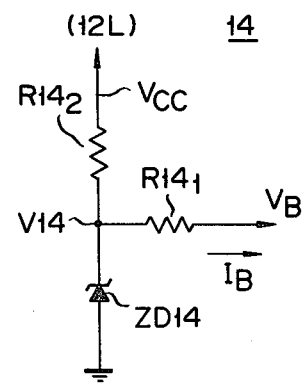
FIG. 9 shows an example of a circuit for forming the bias supply shown in FIG. 4 with a constant voltage source circuit.

FIG. 9 shows an embodiment satisfying the relation (3). The bias supply 14 shown in FIG. 4 comprises a constant voltage source circuit. The base of the oscillator transistor Q10 (shown in FIGS. 4 to 7) is connected to the cathode of a Zener diode ZD14 through a resistor R14₁. The anode of the diode ZD14 is grounded. The cathode of the diode ZD14 is connected to the power supply line 12L through a resistor R14₂. A Zener voltage V14 obtained by the diode ZD14 does not substantially change even when the voltage Vcc changes. Thus, the current IB may be kept constant regardless of changes of the voltage Vcc.

Figure 10:
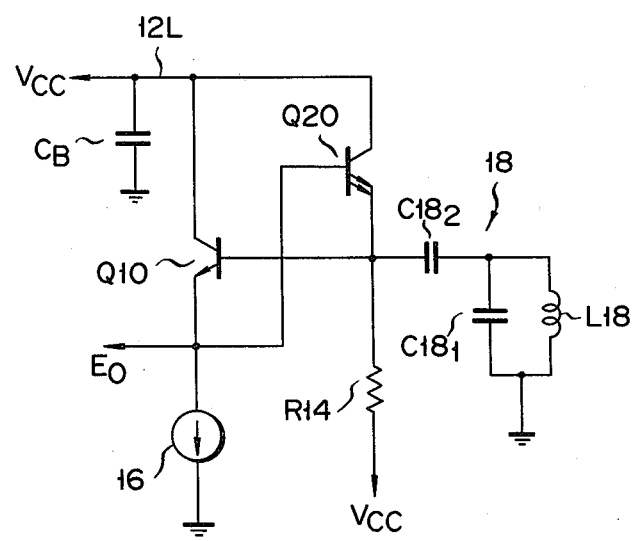
FIG. 10 shows a modification of FIG. 5.

FIG. 10 shows a modification of the circuitry shown in FIG. 5. FIG. 10 represents a case wherein the tank circuit 18 is connected between the base of the transistor Q10 and the circuit ground. The capacitor C18₂ may be connected between the LC circuit (L18 and C18₁) and the circuit ground.

Figure 11:
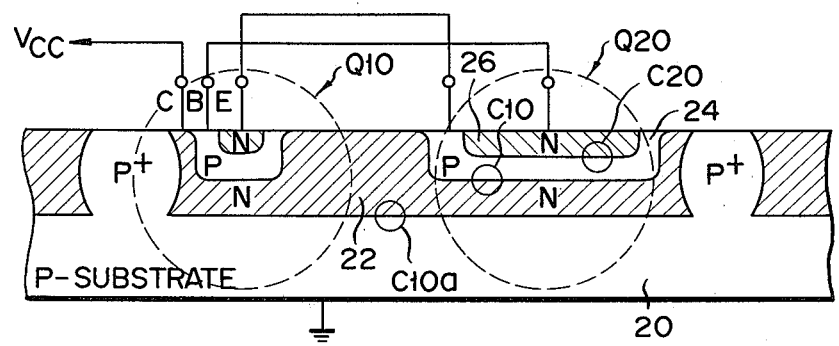
FIG. 11 shows a modification of FIG. 6.

FIG. 11 shows a modification of the IC structure shown in FIG. 6. Although the separation region 28 is formed between the N type collector region of the transistor Q10 and the N type region 22 of the transistor Q20 in FIG. 6, such a separation region is not formed in FIG. 11. With the configuration of FIG. 11, the capacitance of the bypass capacitor C10a may be easily made higher since the area of the P-N junction between the P type substrate 20 and the N type region 22 becomes higher. When it is not particularly necessary to make the capacitance of the capacitor C10a higher, the distance between the transistor Q10 and the transistor Q20 may be easily narrowed with the configuration of FIG. 11. Thus, with the configuration of FIG. 11, the chip size may be made smaller and integration density may be higher than the case of FIG. 6. Further, the wiring 30₁ shown in FIG. 6 is not necessary. The equivalent circuit of FIG. 11 is the same as the circuit of FIG. 7. Further, with the configuration of FIG. 11, the capacitance of the diode C10a may be made higher and the resistance r10a may be made smaller.

FIG. 12 shows a modification of FIG. 10. In FIG. 12, the emitter of the transistor Q20 is connected to the power supply line 12L, and the collector of the transistor Q20 is connected to the base of the transistor Q10. The transistor Q20 is provided for forming the dividing capacitors of the Clapp oscillator and not for current amplification. Thus, either of the N type regions 22 and 26 may be the emitter or the collector. However, it is preferable to use the region 26 as the emitter. Further, diodes D10 and D14 are included in FIG. 12 although they are not necessarily required. These diodes are used for shifting DC level. The potential difference between the line 12L and the base of the transistor Q20 is increased by the forward voltage drop of the diode D10 and the bias voltage VB is reduced by the forward voltage drop of the diode D14.

FIG. 13 shows another basic configuration of the oscillator of the present invention. FIG. 4 shows a Clapp oscillator of the collector-grounded type, and FIG. 13 shows a Clapp (or modified Colpitts) oscillator of the base-grounded type. The basic difference between the configurations of FIGS. 4 and 13 is that the base and the collector of the oscillation transistor Q10 are switched with each other. The bypass capacitor CB2 connected to the base of the transistor Q10 is used for grounding the base line at the oscillation frequency.

Figure 14:
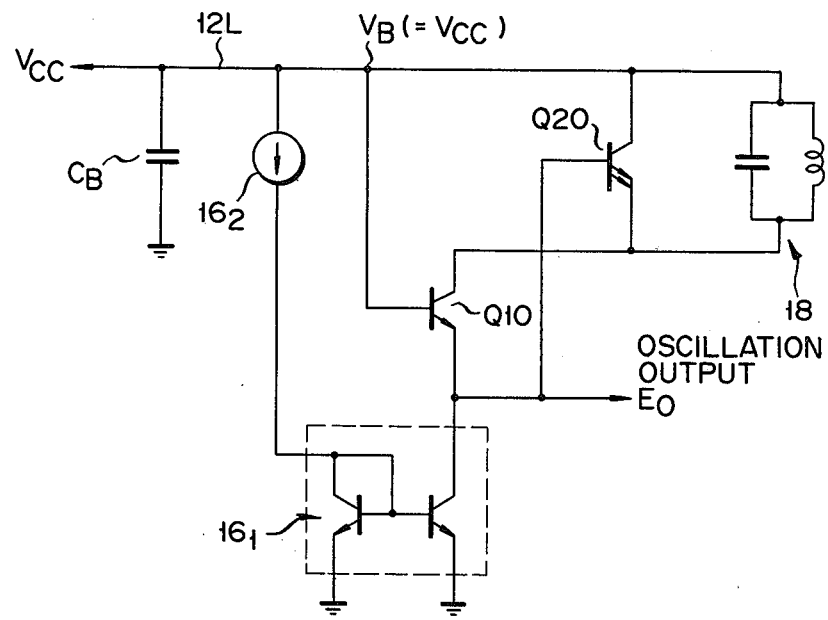
FIG. 14 shows a circuit diagram of one embodiment of the configuration shown in FIG. 13.

FIG. 14 shows an embodiment of the configuration of FIG. 13. A current mirror circuit 16₁ biased or activated by a current source 16₂ is used as the load circuit 16.

Figure 15:
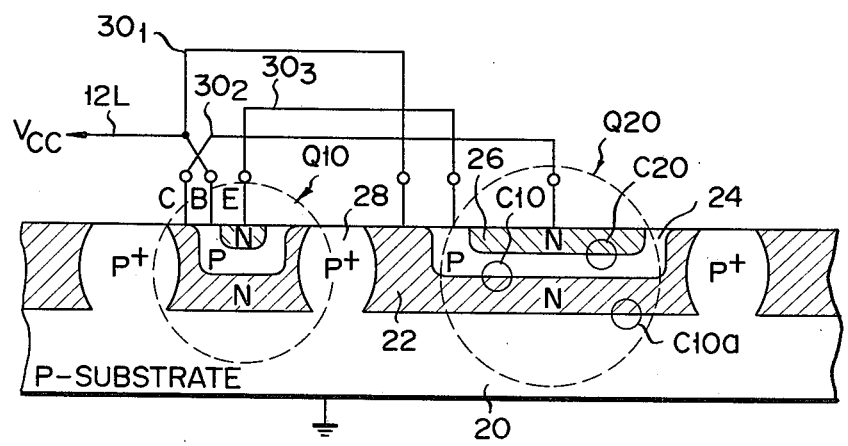
FIG. 15 shows an example of a configuration of the main part of the circuit shown in FIG. 14 formed into an IC.

FIG. 15 shows the transistors Q10 and Q20 of the circuitry shown in FIG. 14 when formed into an IC. In FIG. 15, the wirings 30₁ and 30₂ are connected to the base and the collector of the transistor Q10, respectively. Otherwise, FIG. 15 is the same as the configuration shown in FIG. 6. In FIG. 15, the separation region 28 between the transistors Q10 and Q20 may be omitted when the wiring 30₂ is connected to the region 22 and the wiring 30₁ to the region 26, as in the case of FIG. 11.

Although specific constructions have been illustrated and described herein, it is not intended that the invention be limited to the elements and constructions disclosed. One skilled in the art will recognize that other particular elements or sub-constructions may be used without departing from the scope and spirit of the invention. For example, other layers (not shown) may be formed in addition to the P type region 24 between the N type region 22 and the N type region 26. The regions 22, 24 and 26 are not formed for forming the transistor itself, but for forming the two P-N junction capacitors C10 and C20.

It is to be understood that a fixed reference potential circuit for signal frequencies as recited in the specification does not necessarily mean the power supply line 12L and the circuit ground alone. A circuit portion whose impedance is substantially zero at the oscillation frequency, e.g., the base of the transistor Q16 (FIG. 8) or the cathode of the Zener diode ZD14, may also be considered as "a fixed reference potential circuit for signal frequencies".

The bipolar transistor Q10 may be replaced by any other active element such as FET, circuitry including a tunnel diode (negative resistance device), or the like.

What is claimed is:

1. An oscillator comprising:
   (a) active element means being formed in a semiconductor substrate and having first, second and third electrodes, for providing an oscillation output signal, said second electrode being connected to a resonance circuit adapted for the oscillator and said third electrode of said active element means being coupled to a power supply line and to said resonance circuit;
   (b) first junction capacitor, formed in said substrate, being connected between said power supply line of the oscillator and the first electrode of said active element means, the parasitic capacitance between said first junction capacitor and said substrate therefore being connected to said power line; and
   (c) second junction capacitor, formed in the same location as said first junction capacitor, and being connected between the first electrode and the second electrode of said active element means.

2. An oscillator comprising:
   (a) active element means being formed in a semiconductor substrate and having first, second and third electrodes, for providing an oscillation output signal, said second electrode being connected to a resonance circuit adapted for the oscillator and said third electrode of said active element means being coupled to a power supply line and to said resonance circuit;
   (b) first junction capacitor, formed in said substrate, being connected between said power supply line of the oscillator and the first electrode of said active element means, the parasitic capacitance between said first junction capacitor and said substrate therefore being connected to said power line; and
   (c) second junction capacitor, formed on said first junction capacitor, and being connected between the first electrode and the second electrode of said active element means.

3. An oscillator comprising:
   (a) active element means being formed in a semiconductor substrate and having first, second and third electrodes, for providing an oscillation output signal, said second electrode being connected to a resonance circuit adapted for the oscillator and said third electrode of said active element means being coupled to a power supply line and to said resonance circuit;
   (b) first junction capacitor, formed in said substrate, being connected between said power supply line of the oscillator and the first electrode of said active element means, the parasitic capacitance between said first junction capacitor and said substrate therefore being connected to said power line; and
   (c) second junction capacitor, formed in said first junction capacitor, and being connected between the first electrode and the second electrode of said active element means.

4. An oscillator according to any one of claims 1 to 3, wherein said active element means is formed of a bipolar transistor whose emitter corresponds to said first electrode, whose base corresponds to said second electrode and whose collector corresponds to said third electrode; and said first and second junction capacitors form a bipolar transistor structure whose base portion is connected to the emitter of said active element means, whose emitter portion is connected to the base of said active element means and whose collector portion is connected to the collector of said active element.

5. An oscillator according to any one of claims 1 to 3, wherein said active element means is formed of a bipolar transistor whose emitter corresponds to said first electrode, whose base corresponds to said second electrode and whose collector corresponds to said third electrode; and said first and second junction capacitors form a bipolar transistor structure whose base portion is connected to the emitter of said active element means, whose collector portion is connected to the base of said active element means and whose emitter portion is connected to the collector of said active element means.

6. An oscillator according to any one of claims 1 to 3, wherein said active element means is formed of a bipolar transistor whose emitter corresponds to said first electrode, whose collector corresponds to said second electrode and whose base corresponds to said third electrode; and said first and second junction capacitors form a bipolar transistor structure whose base portion is connected to the emitter of said active element means, whose emitter portion is connected to the base of said active element means and whose collector portion is connected to the collector of said active element means.

7. An oscillator according to any one of claims 1 to 3, wherein said active element means is formed of a bipolar transistor whose emitter corresponds to said first electrode, whose collector corresponds to said second electrode and whose base corresponds to said third electrode; and said first and second junction capacitors form a bipolar transistor structure whose base portion is connected to the emitter of said active element means, whose collector portion is connected to the base of said active element means and whose emitter portion is connected to the collector of said active element means.

8. An oscillator of claim 4, wherein the base of said active element means is connected to a bias supply for providing a bias potential, and said bias potential is proportional to a power supply potential of said power supply line.

9. An oscillator of claim 8, wherein said bias potential is substantially equal to said power supply potential.

10. An oscillator of claim 4, wherein the base of said active element means is connected to bias supply means for providing a fixed bias potential.

11. An oscillator of claim 5, wherein the base of said active element means is connected to bias supply means for providing a bias potential; and said bias potential is proportional to a power supply potential of said power supply line.

12. An oscillator of claim 11, wherein said bias potential is substantially equal to said power supply potential.

13. An oscillator of claim 5, wherein the base of said active element means is connected to bias supply means for providing a fixed bias potential.

14. An oscillator of claim 6, wherein the base of said active element means is connected to bias supply means for providing a bias potential; and said bias potential is proportional to a power supply potential of said power supply line.

15. An oscillator of claim 14, wherein said bias potential is substantially equal to said power supply potential.

16. An oscillator of claim 6, wherein the base of said active element means is connected to bias supply means for providing a fixed bias potential.

17. An oscillator of claim 7, wherein the base of said active element means is connected to bias supply means for providing a bias potential; and said bias potential is proportional to a power supply potential of said power supply line.

18. An oscillator of claim 17, wherein said bias potential is substantially equal to said power supply potential.

19. An oscillator of claim 7, wherein the base of said active element means is connected to bias supply means for providing a fixed bias potential.

20. An oscillator according to any one of claims 1 to 3, wherein the first electrode of said active element means is connected to a load circuit, and said load circuit comprises a constant current circuit.

21. An oscillator according to any one of claims 1 to 3, wherein said semiconductor substrate is a P type and said active element means is an NPN type planar transistor formed in said P type substrate; said first junction capacitor consists of a first N type region connected to the collector region of said NPN transistor and a P type region formed in said first N type region; and said second junction capacitor consists of said P type region and a second N type region formed in said P type region.

22. An oscillator according to any one of claims 1 to 3, wherein said semiconductor substrate is a N type and said active element means is an PNP type planar transistor formed in said N type substrate; said first junction capacitor consists of a first P type region connected to the collector region of said PNP transistor and a N type region formed in said first P type region; and said second junction capacitor consists of said N type region and a second P type region formed in said N type region.

23. An oscillator of claim 4, wherein the first electrode of said active element means is connected to a load circuit, and said load circuit comprises a constant current circuit.

24. An oscillator of claim 4, wherein said semiconductor substrate is a P type and said active element means is an NPN type planar transistor formed in said P type substrate; said first junction capacitor consists of a first N type region connected to the collector region of said NPN transistor and a P type region formed in said first N type region; and said second junction capacitor consists of said P type region and a second N type region formed in said P type region.

25. An oscillator of claim 4, wherein said semiconductor substrate is an N type and said active element means is a PNP type planar transistor formed in said N type substrate; said first junction capacitor consists of a first P type region connected to the collector region of said PNP transistor and an N type region formed in said first P type region; and said second junction capacitor consists of said N type region and a second P type region formed in said N type region.

26. An oscillator of claim 5, wherein the first electrode of said active element means is connected to a load circuit, and said load circuit comprises a constant current circuit.

27. An oscillator of claim 5, wherein said semiconductor substrate is a P type and said active element means is an NPN type planar transistor formed in said P type substrate; said first junction capacitor consists of a first N type region connected to the collector region of said NPN transistor and an P type region formed in said first N type region; and said second junction capacitor consists of said P type region and a second N type region formed in said P type region.

28. An oscillator of claim 5, wherein said semiconductor substrate is an N type and said active element means is a PNP type planar transistor formed in said N type substrate; said first junction capacitor consists of a first P type region connected to the collector region of said PNP transistor and an N type region formed in said first P type region; and said second junction capacitor consists of said N type region and a second P type region formed in said N type region.

29. An oscillator of claim 6, wherein the first electrode of said active element means is connected to a load circuit, and said load circuit comprises a constant current circuit.

30. An oscillator of claim 6, wherein said semiconductor substrate is a P type and said active element means is an NPN type planar transistor formed in said P type substrate; said first junction capacitor consists of a first N type region connected to the collector region of said NPN transistor and a P type region formed in said first N type region; and said second junction capacitor consists of said P type region and a second N type region formed in said P type region.

31. An oscillator of claim 6, wherein said semiconductor substrate is an N type and said active element means is a PNP type planar transistor formed in said N type substrate; said first junction capacitor consists of a first P type region connected to the collector region of said PNP transistor and an N type region formed in said first P type region; and said second junction capacitor consists of said N type region and a second P type region formed in said N type region.

32. An oscillator of claim 7, wherein the first electrode of said active element means is connected to a load circuit, and said load circuit comprises a constant current circuit.

33. An oscillator of claim 7, wherein said semiconductor substrate is a P type and said active element means is an NPN type planar transistor formed in said P type substrate; said first junction capacitor consists of a first N type region connected to the collector region of said NPN transistor and a P type region formed in said first N type region; and said second junction capacitor consists of said P type region and a second N type region formed in said P type region.

34. An oscillator of claim 7, wherein said semiconductor substrate is an N type and said active element means is a PNP type planar transistor formed in said N type substrate; said first junction capacitor consists of a first P type region connected to the collector region of said PNP transistor and an N type region formed in said first P type region; and said second junction capacitor consists of said N type region and a second P type region formed in said N type region.

35. An oscillator comprising:
 (a) power supply means having first (ground) and second terminals;
 (b) active element means having first, second and third electrodes and being formed in a semiconductor substrate, said first and third electrodes of said active element means being connected to the first (ground) and second terminals of said power supply means, respectively;
 (c) resonance circuit connected between the second electrode of said active element means and one of the terminals of said power supply means;
 (d) first junction capacitor formed in said substrate, said first junction capacitor being directly connected between the second electrode of said active element means and the second terminal of said power supply means; and
 (e) second junction capacitor formed in said substrate in a manner that second junction capacitor lies one upon another in a stacked configuration with said first junction capacitor, said second junction capacitor being directly connected between the first and second electrodes of said active element means.

* * * * *